(12) United States Patent
Park et al.

(10) Patent No.: US 11,979,119 B2
(45) Date of Patent: May 7, 2024

(54) APPARATUS AND METHOD FOR AMPLIFYING POWER IN TRANSMISSION DEVICE

(71) Applicant: Samsung Electronics Co., Ltd., Suwon-si (KR)

(72) Inventors: Hyunchul Park, Suwon-si (KR); Byungjoon Park, Suwon-si (KR); Daehyun Kang, Suwon-si (KR); Juho Son, Suwon-si (KR); Sunggi Yang, Suwon-si (KR); Jeongho Lee, Suwon-si (KR); Yunsung Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 571 days.

(21) Appl. No.: 17/250,748

(22) PCT Filed: Aug. 28, 2019

(86) PCT No.: PCT/KR2019/011007
§ 371 (c)(1),
(2) Date: Feb. 26, 2021

(87) PCT Pub. No.: WO2020/045986
PCT Pub. Date: Mar. 5, 2020

(65) Prior Publication Data
US 2021/0218376 A1 Jul. 15, 2021

(30) Foreign Application Priority Data
Aug. 31, 2018 (KR) .................. 10-2018-0103991

(51) Int. Cl.
*H03F 1/22* (2006.01)
*H03F 1/08* (2006.01)
(Continued)

(52) U.S. Cl.
CPC ............. *H03F 3/245* (2013.01); *H03F 1/086* (2013.01); *H03F 1/3205* (2013.01); *H03F 1/565* (2013.01); *H03F 3/193* (2013.01); *H03F 3/21* (2013.01)

(58) Field of Classification Search
CPC ........................................................ H03F 1/22
(Continued)

(56) References Cited

U.S. PATENT DOCUMENTS 5,966,051 A * 10/1999 Griffith ................ H03G 1/0023
330/285
7,170,349 B2 * 1/2007 Bhattacharjee ..... H03F 3/45188
330/311
(Continued)

FOREIGN PATENT DOCUMENTS

KR   10-2010-0024179 A   3/2010
KR   10-1371816 B1   3/2014
(Continued)

OTHER PUBLICATIONS

Kuo et al., "A Fully Integrated 28nm Bluetooth Low-Energy Transmitter with 36% System Efficiency at 3dBm", Sep. 14, 2015, 4 pages.
(Continued)

*Primary Examiner* — Henry Choe

(57) ABSTRACT

Disclosed is a 5G (5th generation) or pre-5G communication system for supporting a data transmission rate higher than that of a 4G (4th generation) communication system such as long-term evolution (LTE). A transmission device comprises: a first amplification unit having a common source structure, including cross coupled capacitors, and amplifying an input signal; a second amplification unit, having a common gate structure, for amplifying a signal output from the first amplification unit; and a first removal unit which is connected to output terminals of the first amplification unit
(Continued)

and input terminals of the second amplification unit and which removes at least one portion of second harmonics. The first removal unit can offset, with respect to a fundamental frequency, at least some of parasitic capacitance generated from the output terminals of the first amplification unit and the input terminals of the second amplification unit, and can ground a signal having a secondary harmonic frequency with respect to the secondary harmonic frequency.

14 Claims, 13 Drawing Sheets

(51) Int. Cl.
*H03F 1/32* (2006.01)
*H03F 1/56* (2006.01)
*H03F 3/193* (2006.01)
*H03F 3/21* (2006.01)
*H03F 3/24* (2006.01)

(58) Field of Classification Search
USPC .......................................... 330/310, 311, 302
See application file for complete search history.

(56) References Cited

U.S. PATENT DOCUMENTS

| | | | |
|---|---|---|---|
| 7,215,221 | B1 | 5/2007 | Ellis et al. |
| 8,493,154 | B1* | 7/2013 | Camargo ................ H03F 3/195 330/296 |
| 8,816,769 | B2* | 8/2014 | Moreira .............. H03F 3/45188 330/253 |
| 11,658,622 | B2* | 5/2023 | Tanaka .................. H03F 3/2176 330/311 |
| 2005/0134386 | A1 | 6/2005 | Westwick et al. |
| 2009/0108943 | A1 | 4/2009 | Kuo et al. |
| 2011/0279184 | A1 | 11/2011 | Chan et al. |
| 2013/0116017 | A1 | 5/2013 | Zhang et al. |
| 2014/0049320 | A1 | 2/2014 | Manetakis |
| 2014/0354358 | A1 | 12/2014 | Kim et al. |
| 2016/0182000 | A1 | 6/2016 | Liao |
| 2018/0145636 | A1 | 5/2018 | Datta et al. |

FOREIGN PATENT DOCUMENTS

| | | |
|---|---|---|
| KR | 10-2016-0020380 A | 2/2016 |
| KR | 10-2017-0096111 A | 8/2017 |

OTHER PUBLICATIONS

Thian, et al., "2.4 GHz High-Efficiency Power-Combining Class-E Amplifier with Transmission-Line Harmonic Traps", Proceedings of Asia-Pacific Microwave Conference 2010, Dec. 7, 2010, 4 pages.
Supplementary European Search Report dated Aug. 3, 2021 in connection with European Patent Application No. EP 19 85 3684, 10 pages.
Notice of Preliminary Rejection dated Jun. 8, 2023, in connection with Korean Application No. 10-2018-0103991, 13 pages.
International Search Report and Written Opinion of the International Searching Authority in connection with International Application No. PCT/KR2019/011007 dated Jan. 2, 2020, 11 pages.
Dabag, Hayg-Taniel, et al., "Analysis and Design of Stacked-FET Millimeter-Wave Power Amplifiers," IEEE Transactions in Microwave Theory and Techniques, vol. 61, No. 4, Apr. 2013, 14 pages.
Dunworth, J.D., et al., "A 28GHz Bulk-CMOS Dual-Polarization Phased-Array Transceiver with 24 Channels for 5G User and Base station Equipment," ISSCC 2018 / Session 4 / mm-Wave Radios for 5G and Beyond / 4.4, 2018 IEEE International Solid-State Circuits Conference, Feb. 12, 2018, 3 pages.
Kim, Hong-Teuk, "A 28-GHz CMOS Direct Conversion Transceiver With Packaged 2×4 Antenna Array for 5G Cellular System." IEEE Journal of Solid-State Circuits, vol. 53, No. 5, May 2018, 15 pages.
Park, Byungjoon, et al., "Highly Linear mm-Wave CMOS Power Amplifier," IEEE Transactions on Microwave Theory and Techniques, vol. 64, No. 12, Dec. 2016, 10 pages.
Sadhu, Bodhisatwa, et al., "A 28-GHz 32-Element TRX Phased-Array IC With Concurrent Dual-Polarized Operation and Orthogonal Phase and Gain Control for 5G Communications," IEEE Journal of Solid-State Circuits, 2017, 19 pages.
Notice of Patent Grant dated Aug. 25, 2023, in connection with Korean Application No. 10-2018-0103991, 5 pages.

* cited by examiner

APPARATUS AND METHOD FOR AMPLIFYING POWER IN TRANSMISSION DEVICE

CROSS-REFERENCE TO RELATED APPLICATIONS

This application is a 371 National Stage of International Application No. PCT/KR2019/011007, filed on Aug. 28, 2019, which claims priority to Korean Patent Application No. 10-2018-0103991, filed Aug. 31, 2018, the disclosures of which are herein incorporated by reference in their entirety.

BACKGROUND

1. Field

The disclosure generally relates to a transmission device, and more particularly, to an apparatus and a method for amplifying power in a transmission device.

2. Description of Related Art

Efforts to develop enhanced $5^{th}$ generation (5G) communication systems or pre-5G communication systems have been ongoing in order to meet the increasing demand for wireless data traffic since $4^{th}$ generation (4G) communication systems were commercialized. For this reason, the 5G communication systems or pre-5G communication systems are called Beyond 4G network communication systems or post long term evolution (LTE) systems.

The 5G communication system is considered to be implemented in a superhigh frequency (mmWave) band (for example, 60 GHz band) to achieve a high data transmission rate. For the 5G communication systems, technologies for beamforming, massive multiple input multiple output (MIMO), full dimensional MIMO (FD-MIMO), array antenna, analog beam-forming, and large scale antenna are being discussed to mitigate a path loss of a radio wave and to increase a transmission distance of a radio wave in the superhigh frequency band.

In addition, technologies for evolved small cell, enhanced small cells, cloud ratio access network (RAN), ultra-dense network, device to device communication (D2D), wireless backhaul, moving network, cooperative communication, coordinated multi-points (CoMP), and interference cancellation in the 5G communication systems are developing to enhance networks of the systems.

In addition, hybrid frequency shift keying and quadrature amplitude modulation (FQAM) and sliding window superposition coding (SWSC), which are advanced coding modulation (ACM) methods, and filter bank multi carrier (FBMC), non-orthogonal multiple access (NOMA), and sparse code multiple access (SCMA) which are enhanced accessing technology in the 5G systems are developing.

The 5G system considers use of a higher frequency band than a conventional cellular communication system (for example, LTE). Accordingly, development of hardware showing excellent performance in a high frequency band is ongoing. For example, technology for preventing reduction of a gain of an amplifier, degradation of matching characteristics, reduction of linearity, etc. in a high frequency band is being researched.

SUMMARY

Based on the above-described discussions, the disclosure provides an apparatus and a method for effectively amplifying power of a transmission signal in a transmission device.

In addition, the disclosure provides an apparatus and a method for reducing a harmonic component generated in a process of processing a transmission signal in a wireless communication system.

In addition, the disclosure provides an apparatus and a method for reducing parasitic capacitance of a circuit for amplifying a transmission signal in a wireless communication system.

According to various embodiments of the disclosure, a transmission device includes: a first amplifier having a common source structure and comprising cross coupled capacitors, and configured to amplify an input signal; a second amplifier of a common gate structure configured to amplify a signal outputted from the first amplifier; and a first termination unit connected to output terminals of the first amplifier and input terminals of the second amplifier, and configured to terminate at least a portion of a second harmonic. The first termination unit may offset at least a portion of parasitic capacitance generated at the output terminals of the first amplifier and the input terminals of the second amplifier with respect to a fundamental frequency, and may ground a signal having a frequency of the second harmonic with respect to the frequency of the second harmonic.

According to various embodiments of the disclosure, an operating method of a transmission device includes: amplifying an input signal by using a first amplification circuit having a common source structure and comprising cross coupled capacitors; amplifying a signal outputted from the first amplification circuit by using a second amplification circuit of a common gate structure; terminating at least a portion of a second harmonic by using a first termination unit connected to output terminals of the first amplification circuit and input terminals of the second amplification circuit; and offsetting at least a portion of parasitic capacitance generated at the output terminals of the first amplification circuit and the input terminals of the second amplification circuit by using the first termination unit.

Various embodiments of the disclosure provide virtual short by using a shunt inductor between a common source (CS) amplifier and a common gate (CG) amplifier of a differential cascode power amplifier, and a finite capacitor performing a function of terminating a $2^{nd}$-order harmonic component, thereby enhancing overall performance of a gain, stability, matching, linearity of the power amplifier usable in millimeter waves.

The effect achieved in the disclosure is not limited to that mentioned above, and other effects that are not mentioned above may be clearly understood to those skilled in the art based on the description provided below.

DETAILED DESCRIPTION

Terms used in the disclosure are used to describe specified embodiments and are not intended to limit the scope of other embodiments. The terms of a singular form may include plural forms unless otherwise specified. All of the terms used herein, which include technical or scientific terms, may have the same meaning that is generally understood by a person skilled in the art. It will be further understood that terms, which are defined in a dictionary, may be interpreted as having the same or similar meanings as or to contextual meanings of the relevant related art and not in an idealized or overly formal way, unless expressly so defined herein in the disclosure. In some cases, even if the terms are terms which are defined in the specification, they should not be interpreted as excluding embodiments of the present disclosure.

In various embodiments of the disclosure described below, hardware-wise approach methods will be described by way of an example. However, various embodiments of the disclosure include technology using both hardware and software, and thus do not exclude software-based approach methods.

The disclosure relates to an apparatus for amplifying a signal in a transmission device. Specifically, the disclosure describes technology for reducing a harmonic component and parasitic capacitance generated in a signal processing process.

As used herein, terms indicating a signal, terms indicating an element of a device or a circuit are merely examples for convenience of explanation. Accordingly, the disclosure is not limited to the terms described below, and other terms having the same technical meanings may be used.

For a system using a high frequency, for example, millimeter waves (mmWave), like a $5^{th}$ generation (5G) system, a phased array radio frequency integrated circuit (RFIC) is actively developing. There is a need for development of a power amplifier having high power, high efficiency, high linearity in the RFIC. To increase output power and a gain, a cascode or stacked structure may be applied, and in this case, overall performance of a power amplifier and a transmission device may be degraded due to reduction of a gain of the power amplifier, degradation of matching characteristics, reduction of linearity, which are caused by a capacitive parasitic component seen as a substrate in a common source (CS) drain and a common gate (CG) source. In addition, differential and capacitor neutralization (Cneu) technology may be applied to enhance a gain, stability, and power in a millimeter wave band (for example, 28/39/60 GHz), and the same technology may be applied to implementation of a cascode/stacked power amplifier. Accordingly, the disclosure suggests various embodiments for resonating a parasitic component between a common source amplifier and a common gate amplifier, and terminating a $2^{nd}$-order harmonic component.

Figure 1:
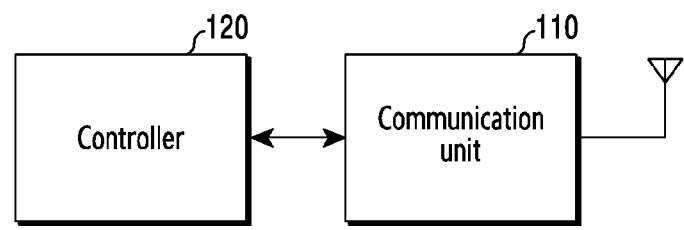
FIG. 1 is a view illustrating a transmission device according to various embodiments of the disclosure.

FIG. 1 illustrates a transmission device according to various embodiments of the disclosure. The transmission device illustrated in FIG. 1 may be understood as devices of various types. For example, the transmission device of FIG. 1 may be understood as a base station performing wireless communication or some component of a terminal (for example, user equipment (UE)).

Referring to FIG. 1, the transmission device includes a communication unit 110 and a controller 120.

The communication unit 110 performs functions for transmitting and receiving signals via a wireless channel. For example, the communication unit 110 may perform a function of converting between a baseband signal and a bit stream according to a physical layer standard of a system. For example, when transmitting data, the communication unit 110 may generate complex symbols by encoding and modulating a transmission bit stream. In addition, when receiving data, the communication unit 110 may restore a reception bit stream by demodulating and decoding a baseband signal.

In addition, the communication unit 110 may up-convert a baseband signal into a radio frequency (RF) band signal, and then may transmit the signal via an antenna, and may down-convert an RF band signal received via an antenna into a baseband signal. To achieve this, the communication unit 110 may include a transmission filter, a reception filter, an amplifier, a mixer, an oscillator, a digital to analog converter (DAC), an analog to digital converter (ADC), or the like. In addition, the communication unit 110 may include a plurality of transmission and reception paths. Furthermore, the communication unit 110 may include at least one antenna array including a plurality of antenna elements.

In the hardware aspect, the communication unit 110 may include a digital unit and an analog unit, and the analog unit may include a plurality of sub-units according to operating power, an operating frequency, or the like. The digital unit may be implemented by at least one processor (for example, a digital signal processor (DSP)).

The communication unit 110 may transmit and receive signals as described above. Accordingly, an entirety or a portion of the communication unit 110 may be referred to as a "transmitter," "receiver," or "transceiver." In addition, in the following description, transmitting and receiving via a wireless channel may be used as a meaning including processing by the communication unit 110 as described above.

The controller 120 controls overall operations of the transmission device. For example, the controller 120 may transmit and receive signals via the communication unit 110. To achieve this, the controller 120 may include at least one processor. According to various embodiments, the controller 120 may control the transmission device to perform operations according to various embodiments as will be described below.

Figure 2:
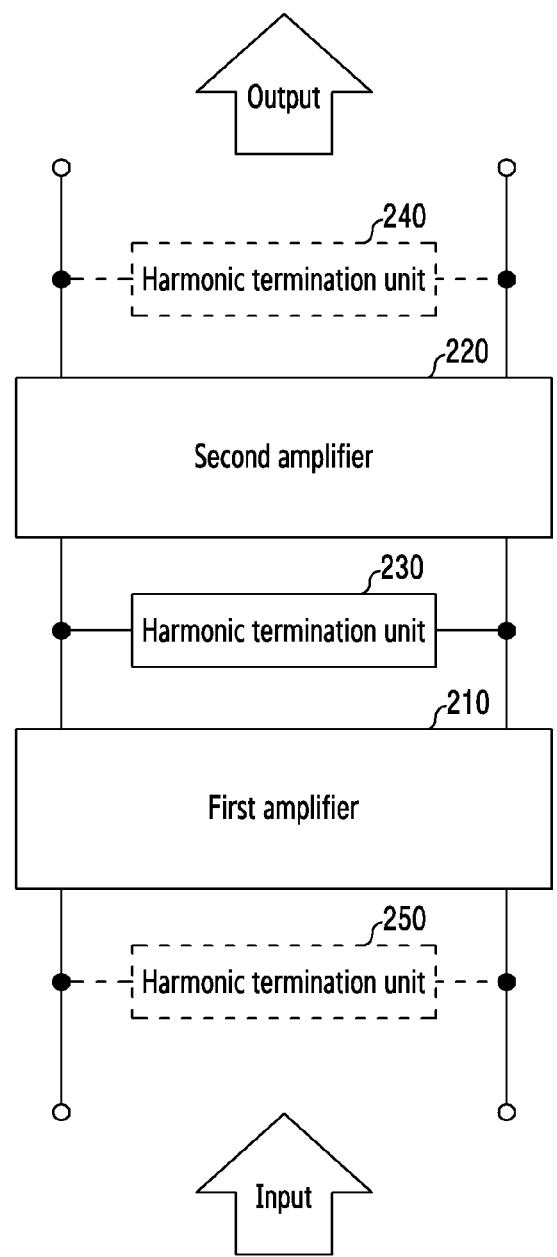
FIG. 2 is a view illustrating a configuration of a circuit for amplifying a signal in a transmission device according to various embodiments of the disclosure.

FIG. 2 illustrates a configuration of a circuit for amplifying a signal in a transmission device according to various embodiments of the disclosure. FIG. 2 may be understood as a portion of the communication unit 110.

Referring to FIG. 2, the circuit may include a first amplifier 210, a second amplifier 220, a harmonic termination unit 230, a harmonic termination unit 240, a harmonic termination unit 250. According to another embodiment, at least one of the harmonic termination unit 240 and the harmonic termination unit 250 may be excluded.

The first amplifier 210 amplifies an input signal and the second amplifier 220 amplifies a signal outputted from the first amplifier 210. That is, the first amplifier 210 and the second amplifier 220 form a cascode or stacked amplifier. The first amplifier 210 is connected to an input terminal of a power amplifier, and the second amplifier 220 is connected to an output terminal of the power amplifier. The first amplifier 210 and the second amplifier 220 may be differential amplifiers. For example, the first amplifier 210 may have a common source (CS) structure, and the second amplifier 220 may have a common gate (CG) structure. In addition, the first amplifier 210 may have a structure according to capacitor neutralization (Cneu) technology, that is, cross-couple-capacitors. In this case, the first amplifier 210 may increase an overall gain of the amplification circuit.

The harmonic termination units 230, 240, 250 terminate or reduce a second-order harmonic signal of a fundamental frequency. Herein, the fundamental frequency may be a carrier frequency of a transmission signal. To achieve this, the harmonic termination units 230, 240, 250 may ground the $2^{nd}$-order harmonic signal. For example, the harmonic termination units 230, 240, 250 may have a structure of a filter allowing a signal of a frequency band of a $2^{nd}$-order harmonic to pass therethrough.

In addition, at least one of the harmonic termination units 230, 240, 250 may offset at least a portion of parasitic capacitance generated in circuits of the first amplifier 210 and the second amplifier 220. To achieve this, at least one of the harmonic termination units 230, 240, 250 may include an element having inductance corresponding to the parasitic capacitance.

Figure 3:
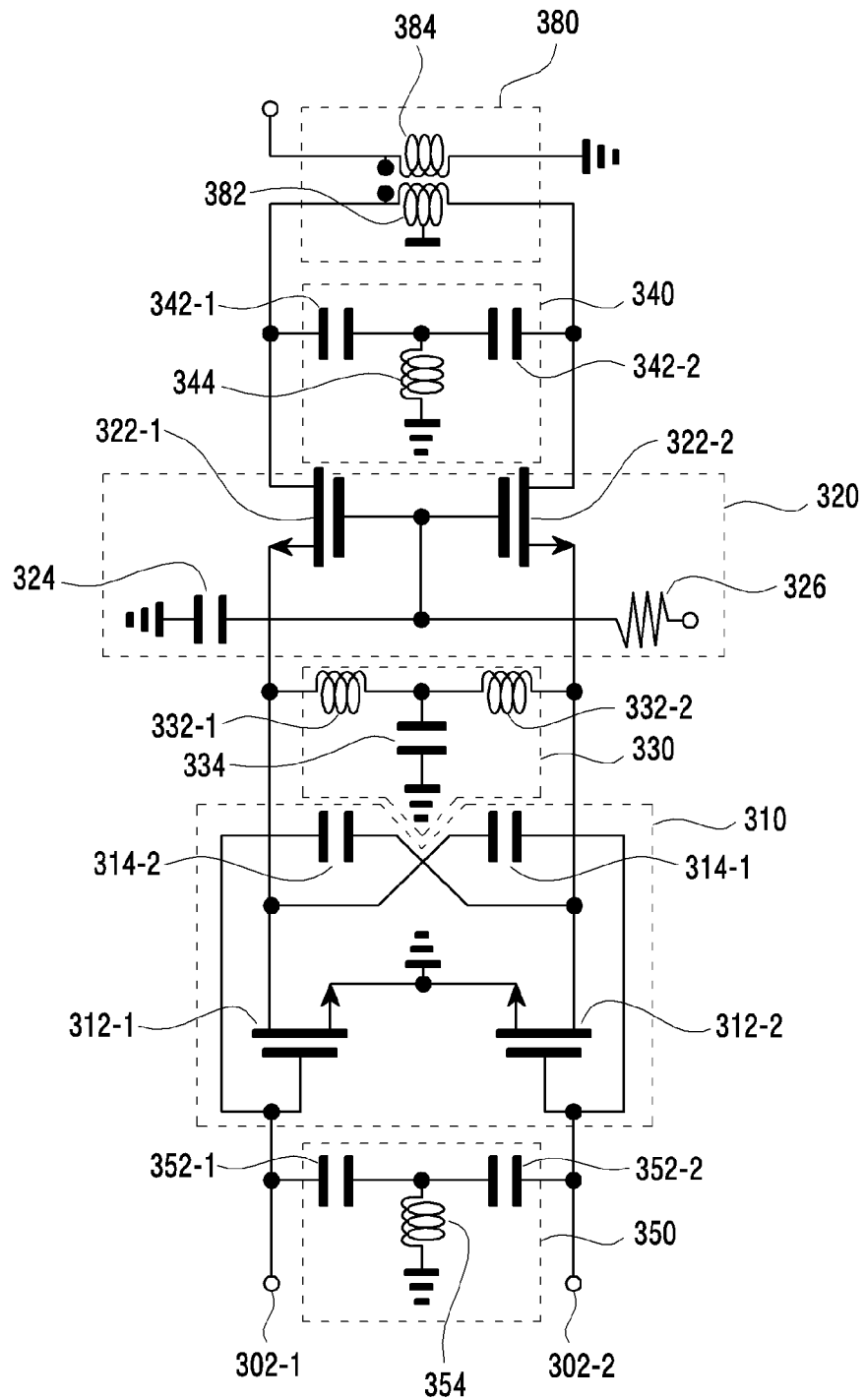
FIG. 3 is a view illustrating an implementation example of a circuit for amplifying a signal in a transmission device according to various embodiments of the disclosure.

FIG. 3 illustrates an implementation example of a circuit for amplifying a signal in a transmission device according to various embodiments of the disclosure.

Referring to FIG. 3, a first amplifier 310 is a differential amplifier of a common source structure, and includes cross-couple capacitors. Specifically, the first amplifier 310 includes a first transistor 312-1 and a second transistor 312-2. Source terminals of the two transistors 312-1 and 312-2 are grounded, and gate terminals are connected with input terminals 302-1 and 302-2. A drain terminal of the first transistor 312-1 is connected with one end of a first capacitor 314-1, and the other end of the first capacitor 314-1 is connected with a gate terminal of the second transistor 312-2. A drain terminal of the second transistor 312-2 is connected with one end of a second capacitor 314-2, and the other end of the second capacitor 314-2 is connected with a gate terminal of the first transistor 312-1. In addition, the drain terminals of the two transistors 312-1 and 312-2 are output terminals of the first amplifier 310 and are connected with input terminals of a second amplifier 320.

The second amplifier 320 is a differential amplifier of a common gate structure. Specifically, the second amplifier 320 includes a first transistor 322-1 and a second transistor 322-2, and gate terminals of the transistors 322-1 and 322-2 are connected with each other and are connected with one end of a capacitor 324 and one end of a resistor 326. The other end of the capacitor 324 is grounded and a vias voltage is applied to the other end of the resistor 326. Source terminals of the transistors 322-1 and 322-2 are input terminals of the second amplifier 320 and are connected with the first amplifier 310, and the drain terminals are output terminals.

A harmonic termination unit 330 includes a first inductor 332-1, a second inductor 322-2, and a capacitor 334. One end of the first inductor 332-1 is connected with one of the output terminals of the first amplifier 310 and one of the input terminals of the second amplifier 320, and one end of the second inductor 332-2 is connected with the other one of the output terminals of the first amplifier 310 and the other one of the input terminals of the second amplifier 320. The other ends of the first inductor 332-1 and the second inductor 332-2 are connected with each other, and are also connected with one end of the capacitor 334. The other end of the capacitor 334 is grounded. The first inductor 332-1, the second inductor 333-2 may be referred to as shunt inductors.

A harmonic termination unit 340 includes a first capacitor 342-1, a second capacitor 342-2, and an inductor 344. One end of the first capacitor 342-1 is connected with one of the output terminals of the second amplifier 320, and one end of the second capacitor 342-2 is connected with the other one of the output terminals of the second amplifier 320. The other ends of the first capacitor 342-1 and the second capacitor 342-2 are connected with one another, and are also connected with one end of the inductor 344. The other end of the inductor 344 is grounded.

A harmonic termination unit 350 includes a first capacitor 352-1, a second capacitor 352-2, and an inductor 354. One end of the first capacitor 352-1 is connected to one of the input terminals of the first amplifier 310, and one end of the second capacitor 352-2 is connected with the other one of the input terminals of the first amplifier 310. The other ends of the first capacitor 352-1 and the second capacitor 352-2 are connected with each other, and are also connected with one end of the inductor 354. The other end of the inductor 354 is grounded.

A transformer 380 converts a differential signal outputted from the second amplifier 320 into a single-ended signal. To achieve this, the transformer 380 includes a primary coil 382 and a secondary coil 384.

In the embodiment of FIG. 3, one of the illustrated harmonic termination units 330, 340, 350 has a structure of a shunt inductor, and the other harmonic termination units have a structure of a shunt capacitor. However, according to other embodiments, two or three of the harmonic termination units 330, 340, 350 may have the structure of the shunt inductor.

As described above, various embodiments of the disclosure can enhance a gain and stability by using a differential shunt inductor which resonates a parasitic component between a common source amplifier and a common gate amplifier, and can enhance linearity of a power amplifier by arranging a finite capacitor performing a $2^{nd}$-order harmonic termination function in an inductor and a center tap. In addition, various embodiments of the disclosure can enhance performance of the power amplifier by reducing a secondary non-linearity feedback component generated by use of capacitor neutralization technology by using a circuit for terminating a $2^{nd}$-order harmonic.

The above-described technology using the shunt inductor may be substituted for normal $2^{nd}$-order harmonic termination technology, or may be additionally applied. In addition, the above-described technology using the shunt inductor may be applied to a differential cascode power amplifier or a differential stacked power amplifier without degrading performance.

Figure 4A:
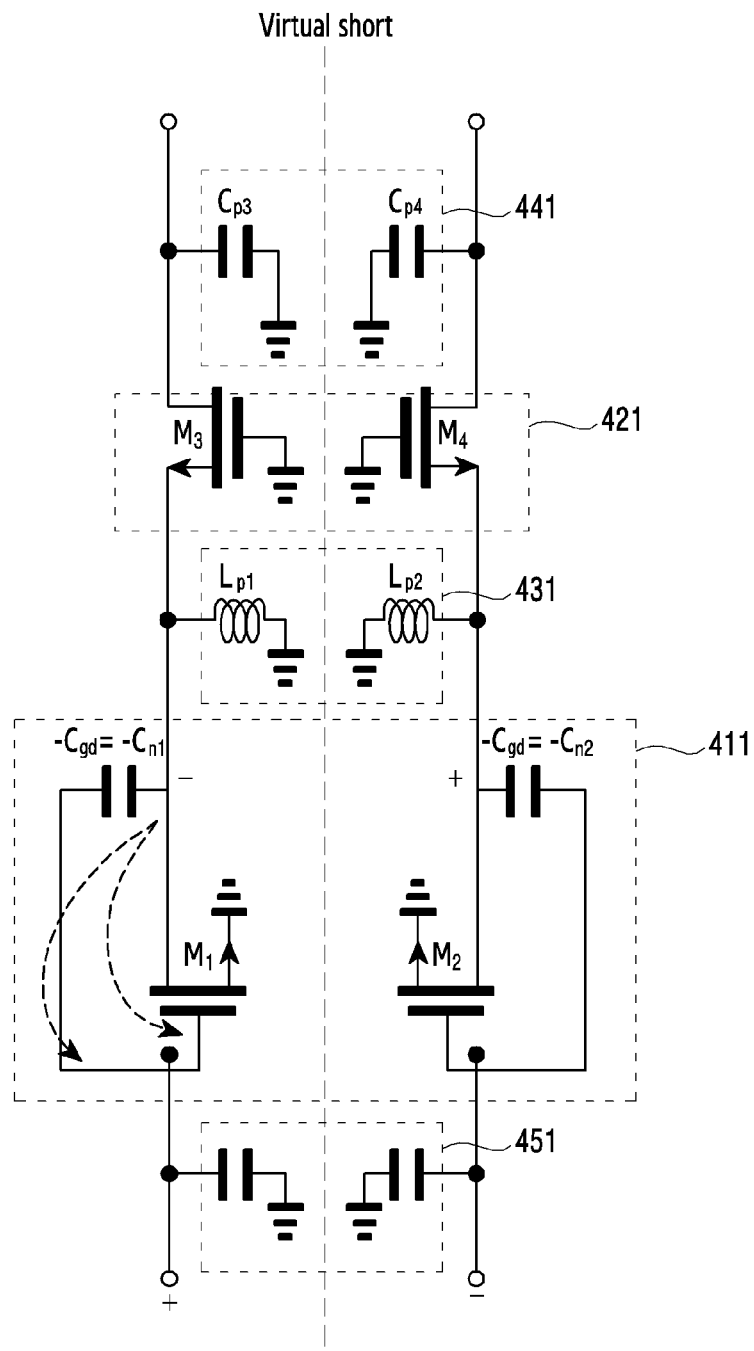
FIGS. 4A to 4C are views illustrating equivalent circuits illustrating an operational principle of a circuit for amplifying a signal in a transmission device according to various embodiments of the disclosure.
Figure 4B:
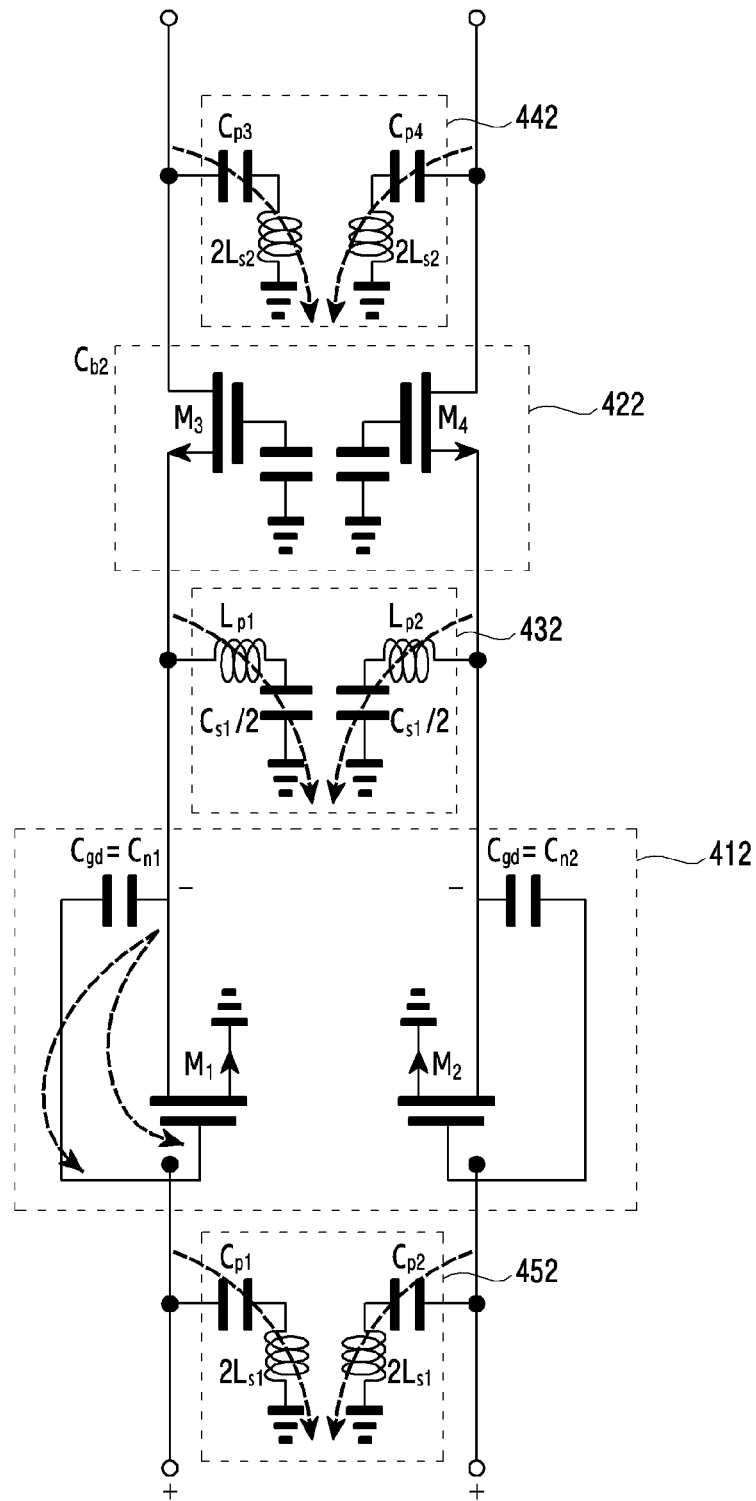
Figure 4C:
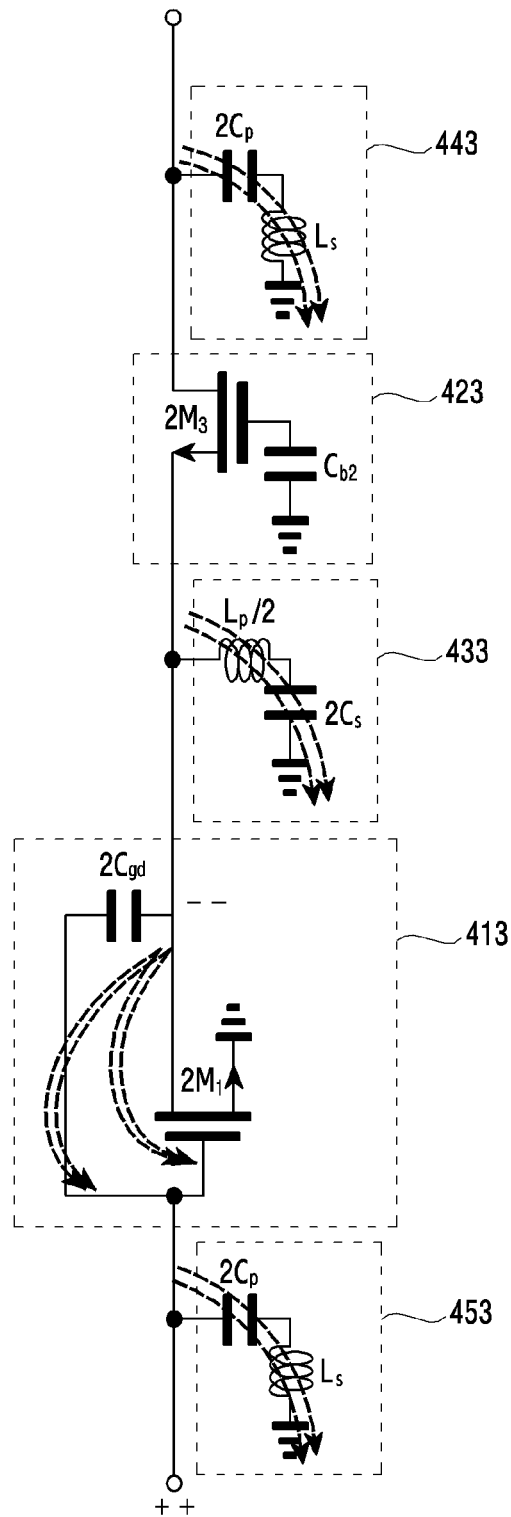

FIGS. 4A to 4C illustrate equivalent circuits showing operational principles of a circuit for amplifying a signal in a transmission device according to various embodiments of the disclosure. FIGS. 4A to 4C illustrate equivalent circuits of each frequency regarding the implementation example of FIG. 3.

FIG. 4A illustrates an operation of a circuit with respect to a differential mode, that is, a fundamental frequency. In the case of a first equivalent circuit 411 regarding the first amplifier 310, compared with those of FIG. 3, source terminals of two transistors are grounded and a drain terminal of each of the two transistors is connected with one end of each of capacitors, and the other end of each of the capacitors is connected with a gate of each of the two transistors. In the case of a second equivalent circuit 421 regarding the second amplifier 320, gates of two transistors are grounded. In the case of a third equivalent circuit 431 regarding the harmonic termination unit 330, one end of each of two inductors is connected to output terminals of the first equivalent circuit 411 and input terminals of the second equivalent circuit, and the other end of each of the two inductors is grounded. In the case of a fourth equivalent circuit 441 regarding the harmonic termination unit 340, one end of each of two capacitors is connected to output terminals of the second equivalent circuit, and the other end of each of the two capacitors is grounded. In the case of a fifth equivalent circuit 451 regarding the harmonic termination unit 350, one end of each of two capacitors is connected to input terminals of the first equivalent circuit and the other end of each of the two capacitors is grounded.

Referring to FIG. 4A, in the first equivalent circuit 411 in the differential mode, a path having capacitance of —$C_{gd}$ is formed by a capacitor-neutralized circuit. Since this path differs from a path having capacitance of $C_{gd}$ in the transistor in the polarity of a current, a feedback current is offset. Accordingly, isolation of a core transistor circuit of a differential operation may increase. In addition, a center tap of a shunt inductor in the third equivalent circuit 431 positioned between the first equivalent circuit 411 and the second equivalent circuit 421 is a virtual ground. Accordingly, with respect to parasitic capacitance facing a substrate at drain terminals of the transistors in the first equivalent circuit 411 and at source terminals of the transistors in the second equivalent circuit 421, inductors in the third equivalent circuit 431 may resonate, and accordingly, a leakage of a signal may be offset. In other words, parasitic capacitances generated at the drain terminals of the transistors in the first equivalent circuit 411 and at the source terminals of the transistors in the second equivalent circuit 421 are offset by the inductors in the third equivalent circuit 431. That is, the inductors in the third equivalent circuit 431 terminate the parasitic capacitances generated in the transistors. To this end, a gain loss of the power amplifier can be prevented and performance can be enhanced. To terminate such parasitic capacitances, inductance of the inductor in the third equivalent circuit 431 may be set to a value to be able to resonate with the parasitic capacitance. For example, the inductance of the inductor in the third equivalent circuit 431 may be set as shown in Equation 1 presented below:

$$L_{P1} = \frac{1}{(2\pi f_{fund})^2 C_p} \qquad \text{Equation 1}$$

In Equation 1, $L_{P1}$ is an inductance of the inductor in the third equivalent circuit 431, $f_{fund}$ is a fundamental frequency, $C_p$ is parasitic capacitance. $C_p$ may be understood as a sum of parasitic capacitance generated at the drain terminal of the transistor in the first equivalent circuit 411 and parasitic capacitance generated at the source terminal in the second equivalent circuit 421.

FIG. 4B illustrates an operation of a circuit with respect to a common mode, that is, a $2^{nd}$-order harmonic frequency. In the case of a first equivalent circuit 412 regarding the first amplifier 310, compared with those of FIG. 3, source terminals of two transistors are grounded, and a drain terminal of each of the two transistors is connected with one end of each of capacitors, and the other end of each of the capacitors is connected with a gate of each of the two transistors. In the case of a second equivalent circuit 422 regarding the second amplifier 320, each of gates of two transistors is connected to one end of each of capacitors, and the other end of each of the capacitors is grounded. In the case of a third equivalent 432 regarding the harmonic termination unit 330, one end of each of two inductors are connected with output terminals of the first equivalent circuit 421 and input terminals of the second equivalent circuit, and the other end of each of the two inductors is connected with one end of each of capacitors, and the other end of each of the capacitors is grounded. In the case of a fourth equivalent circuit 442 regarding the harmonic termination unit 340, one end of each of two capacitors is connected to output terminals of the second equivalent circuit, and the other end of each of the two capacitors is connected to one end of each of inductors, and the other end of each of the inductors is grounded. In the case of a fifth equivalent circuit 452 regarding the harmonic termination unit 350, one end of each of two capacitors is connected to input terminals of the first equivalent circuit, and the other end of each of the two capacitors is connected to one end of each of inductors, and the other end of each of the inductors is grounded.

Referring to FIG. 4B, in the common mode, with respect to the $2^{nd}$-order harmonic frequency which is two times an existing frequency, capacitance of the cross-coupled capacitor neutralization circuit within the first equivalent circuit 412 overlaps $C_{gd}$ in the transistor. Accordingly, a great feedback component of the $2^{nd}$-order harmonic frequency occurs between a drain and a source of the transistor. However, since the pair of the inductor and the capacitor within the third equivalent circuit 432 according to an embodiment operates as a series short circuit, the $2^{nd}$-order harmonic component is suppressed. Accordingly, linearity of the power amplifier can be greatly enhanced. Similarly, the pairs of the capacitors and the inductors within the fourth equivalent circuit 442 and the fifth equivalent circuit 452 also operate as the series short circuit, and accordingly, the $2^{nd}$-order harmonic component at the input terminals of the first equivalent circuit 412 and the output terminals of the second equivalent circuit 422 is suppressed. To suppress the $2^{nd}$-order harmonic component, the capacitance of the capacitor in the third equivalent circuit 432 may be set to resonate at the $2^{nd}$-order harmonic frequency when being coupled with the inductor. For example, the capacitance of the capacitor in the third equivalent circuit 432 may be set as shown in Equation 2 presented below:

$$C_{s1/2} = \frac{1}{(2\pi f_{2nd})^2 L_{p1}} \qquad \text{Equation 2}$$

In Equation 2, $C_{s1/2}$ is capacitance of the capacitor in the third equivalent circuit 432, $f_{2nd}$ is a $2^{nd}$-order harmonic frequency, and $L_{p1}$ is an inductance of the inductor in the third equivalent circuit 432. Herein, $C_{s1/2}$ corresponds to half of the capacitance of the capacitor 334 of the harmonic termination unit 330.

FIG. 4C more schematically illustrates an operation of a circuit with respect to a common mode, that is, a $2^{nd}$-order harmonic frequency. In the case of a first equivalent circuit 413 regarding the first amplifier 310, compared with those of FIG. 3, source terminals of two transistors are grounded and drain terminals of the transistors are connected with one end of a capacitor, and the other end of the capacitor is connected with gates of the transistors. In the case of a second equivalent circuit 423 regarding the second amplifier 320, each of gates of the two transistors is connected to one end of a capacitor, and the other end of the capacitor is grounded. In the case of a third equivalent circuit 433 regarding the harmonic termination unit 330, one end of each of two inductors is connected to output terminals of the first equivalent circuit 413 and input terminals of the second equivalent circuit, and the other end of the inductor is connected to one end of a capacitor and the other end of the capacitor is grounded. In the case of a fourth equivalent circuit 443 regarding the harmonic termination unit 340, one end of two capacitors is connected to output terminals of the second equivalent circuit, and the other end of the two capacitors is connected to one end of an inductor and the other end of the inductor is grounded. In the case of a fifth equivalent circuit 453 regarding the harmonic termination unit 350, one end of two capacitors is connected to input terminals of the first equivalent circuit, and the other end of the two capacitors is connected to one end of an inductor and the other end of the inductor is grounded.

Referring to FIG. 4C, in the common mode, with respect to the $2^{nd}$-order harmonic frequency which is two times an existing frequency, capacitance of the cross-coupled capacitor neutralization circuit within the first equivalent circuit 413 overlaps $C_{gd}$ in the transistor. Accordingly, a great feedback component of the $2^{nd}$-order harmonic frequency occurs between a drain and a source of the transistor. However, since the pair of the inductor and the capacitor within the third equivalent circuit 433 according to an embodiment operates as a series short circuit, the 2nd-order harmonic component is suppressed. Accordingly, linearity of the power amplifier can be greatly enhanced. Similarly, the pairs of the capacitors and the inductors within the fourth equivalent circuit 443 and the fifth equivalent circuit 453 also operate as the series short circuit, and accordingly, the 2nd-order harmonic component at the input terminals of the first equivalent circuit 413 and the output terminals of the third equivalent circuit 433 is suppressed.

Figure 5:
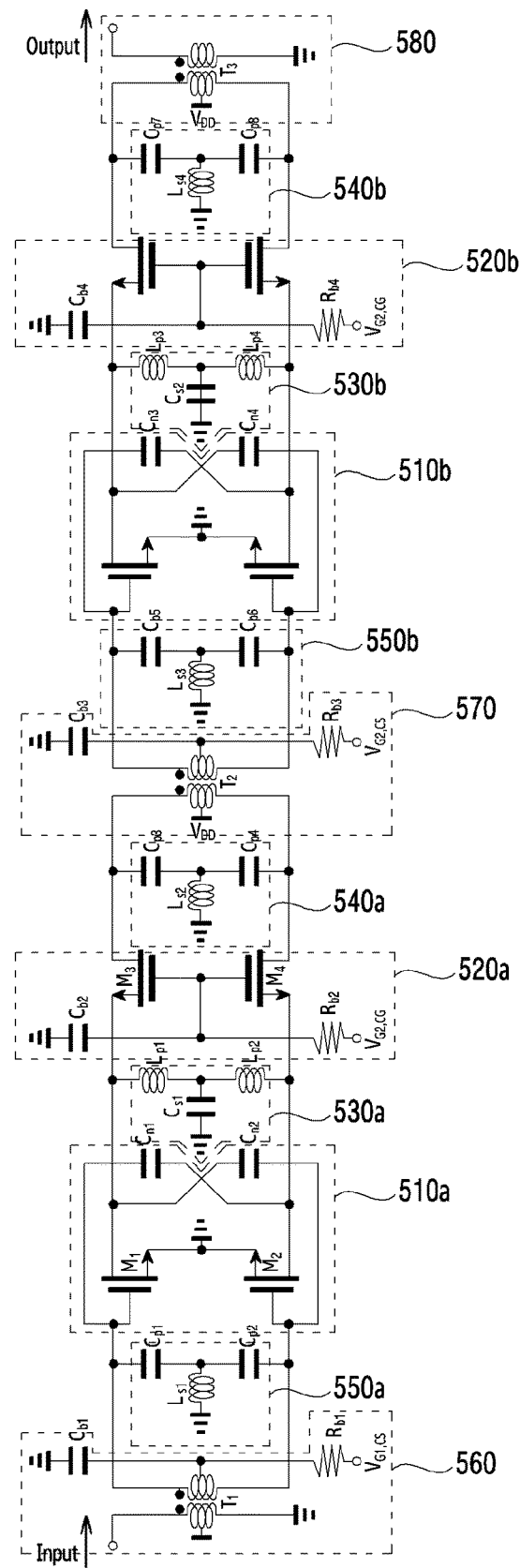
FIG. 5 is a view illustrating another implementation example of a circuit for amplifying a signal in a transmission device according to various embodiments of the disclosure.

FIG. 5 illustrates another implementation example of a circuit for amplifying a signal in a transmission device according to various embodiments of the disclosure. FIG. 5 illustrates a structure in which two power amplifiers are connected.

Referring to FIG. 5, a transformer 560 is connected to input terminals, and after that, a harmonic termination unit 550a of a low pass filter (LPF) type, an amplifier 510a of a common source structure, a harmonic termination unit 530a of a high pass filter (HPF) type, an amplifier 520a of a common gate structure, a harmonic termination unit 540a of an LPF type, a transformer 570, a harmonic termination unit 550b of LPF type, an amplifier 510b of a common source structure, a harmonic termination unit 530b of an HPF type, an amplifier 520b of a common gate structure, a harmonic termination unit 540b of an LPF type, and a transformer 580.

As shown in FIG. 5, the plurality of harmonic termination units 530a, 540a, 550a, 530b, 540b, 550b for terminating a $2^{nd}$-order harmonic component are disposed to enhance performance of the power amplifiers. That is, circuits for terminating the $2^{nd}$-order harmonic component, including shunt capacitors (for example, $C_{p1}$, $C_{p2}$, $C_{p3}$, $C_{p4}$, $C_{p5}$, $C_{p6}$, $C_{p7}$, $C_{p8}$ and inductors (for example, $L_{s1}$, $L_{s2}$, $L_{s3}$, $L_{s4}$) connected to centers thereof, are formed at respective inputs and outputs of cascode/stacked amplifiers. Additionally, circuits for terminating the $2^{nd}$-order harmonic component, including shunt inductors (for example, $L_{p1}$, $L_{p2}$, $L_{p3}$, $L_{p4}$) and capacitors (for example, Cs1, Cs2) connected in centers thereof, are further formed between a common source amplifier and a common gate amplifier of each of the cascode/stacked amplifiers. Accordingly, the gain, stability, matching, linearity of all power amplifiers can be enhanced.

An entirety or a part of the parasitic capacitance generated between the common source amplifier and the common gate amplifier is offset by the shunt inductor, and accordingly, the gain, efficiency, stability of the cascode power amplifier can be enhanced. In addition, since impedance from the output terminal of the common source amplifier to the input terminal has a very low value (for example, 10-Ohm or less) at a $2^{nd}$-order harmonic frequency, a distortion component may be greatly fed back to the input terminal of the common source amplifier, but a $2^{nd}$-harmonic component generated at the output terminal of the common source amplifier and the input terminal of the common gate amplifier is suppressed by the circuit for terminating the $2^{nd}$-order harmonic. Accordingly, a phenomenon that the $2^{nd}$-order harmonic component is transmitted to the input terminal of the common source amplifier or the output of the common gate amplifier can be reduced, and as a result, secondary distortion caused by the $2^{nd}$-order harmonic component can be reduced.

Figure 6:
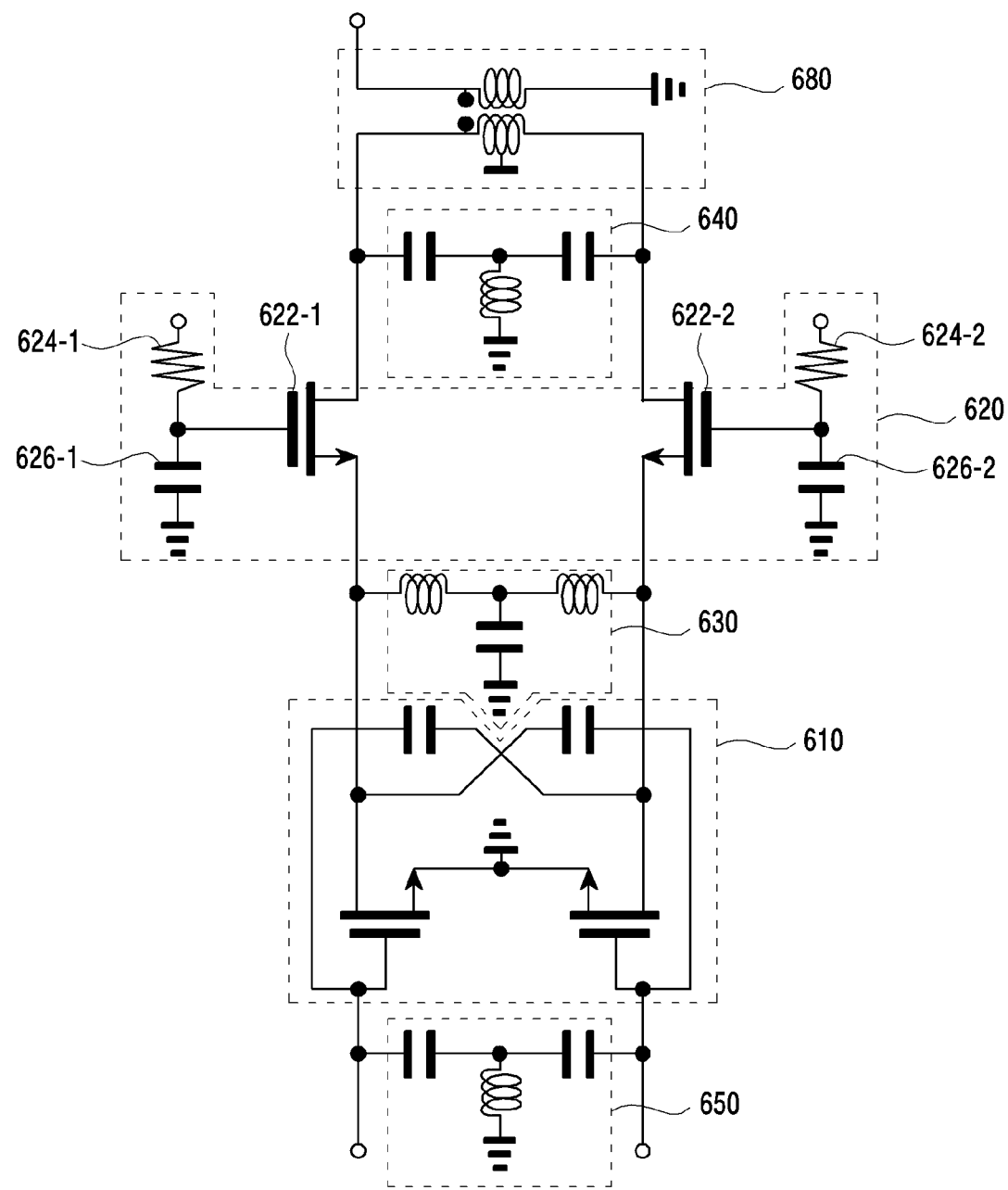
FIG. 6 is a view illustrating still another implementation example of a circuit for amplifying a signal in a transmission device according to various embodiments of the disclosure.

FIG. 6 illustrates still another implementation example of a circuit for amplifying a signal in a transmission device according to various embodiments of the disclosure. FIG. 6 illustrates a structure in which a harmonic termination unit of a shunt inductor structure is applied to a stacked power amplifier.

Referring to FIG. 6, a circuit includes a first amplifier 610, a second amplifier 620, a harmonic termination unit 630, a harmonic termination unit 640, a harmonic termination unit 650. The first amplifier 610, the harmonic termination unit 630, the harmonic termination unit 640, the harmonic termination unit 650 have the same configurations as the first amplifier 310, the harmonic termination unit 330, the harmonic termination unit 340, the harmonic termination unit 350 of FIG. 3. The second amplifier 620 includes a first transistor 622-1 and a second transistor 622-2. A gate terminal of the first transistor 622-1 is connected with one end of a first resistor 624-1 and one end of a first capacitor 626-1, and the other end of the first capacitor 626-1 is grounded. A gate terminal of the second transistor 622-2 is connected with one end of a second resistor 624-2 and one end of a second capacitor 626-2, and the other end of the second capacitor 626-2 is grounded.

Figure 7:
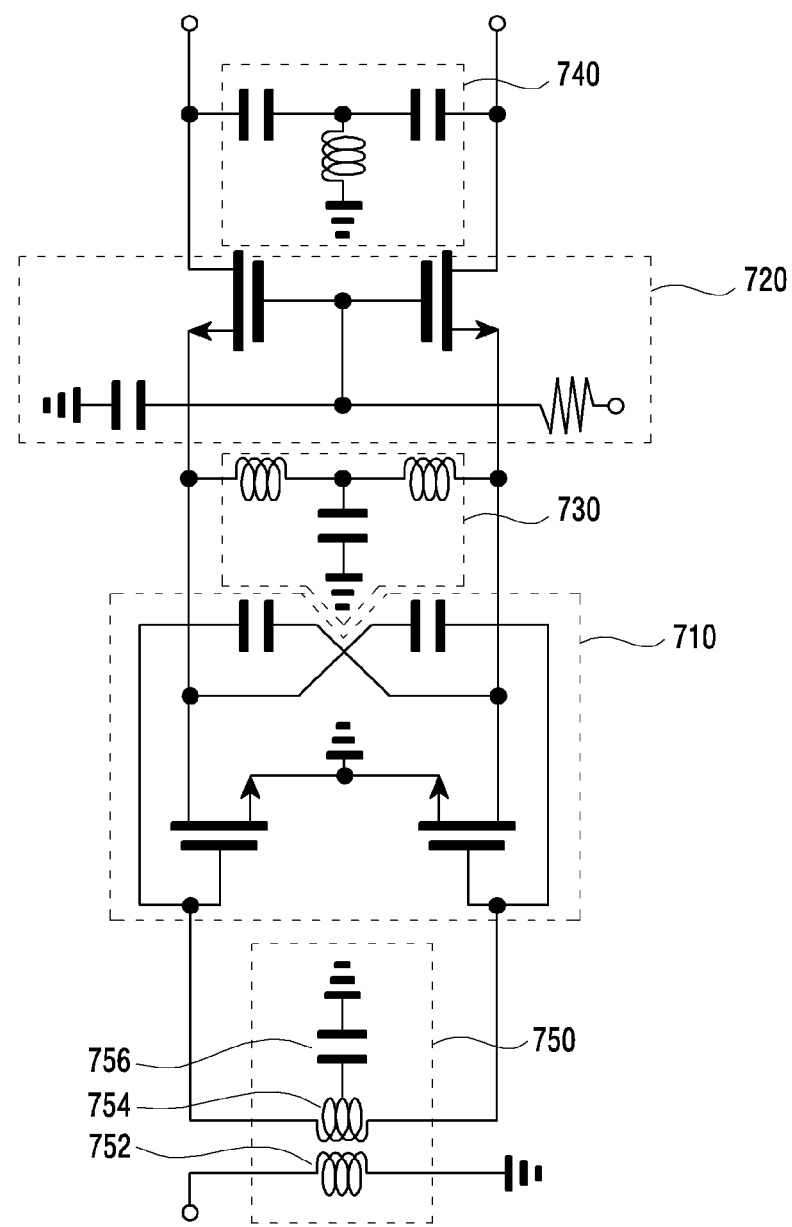
FIG. 7 is a view illustrating yet another implementation example of a circuit for amplifying a signal in a transmission device according to various embodiments of the disclosure.

FIG. 7 illustrates yet another embodiment of a circuit for amplifying a signal in a transmission device according to various embodiments of the disclosure. FIG. 7 illustrates a structure in which a transformer disposed at an input terminal of a power amplifier, and a harmonic termination unit of a shunt inductor structure are coupled to each other.

Referring to FIG. 7, a circuit includes a first amplifier 710, a second amplifier 720, a harmonic termination unit 730, a harmonic termination unit 740, a harmonic termination unit 750. The first amplifier 710, the second amplifier 720, the harmonic termination unit 730, the harmonic termination unit 740 have the same configurations as the first amplifier 310, the second amplifier 320, the harmonic termination unit 330, the harmonic termination unit 340 of FIG. 3. The harmonic termination unit 750 has a shunt inductor structure coupled with a transformer. Specifically, the harmonic termination unit 750 includes a primary coil 752 and a secondary coil 754, and one end of a capacitor 756 is connected to a center of the secondary coil 754 and the other end of the capacitor 756 is grounded. Accordingly, the primary coil 752 and the secondary coil 754 operate as a transformer, and also, the secondary coil 754 operates as a shunt inductor.

In the circuits according to the above-described various embodiments, a circuit for terminating a harmonic (for example, a harmonic termination unit) includes at least one inductor and at least one capacitor. In this case, a frequency band of a signal that can be removed may vary according to an inductance of one inductor and capacitance of at least one capacitor. Accordingly, a variable capacitor may be installed as at least one capacitor in case that a frequency of a $2^{nd}$-order harmonic is changed, and the variable capacitor may be controlled according to the frequency of the $2^{nd}$-order harmonic.

Figure 8:
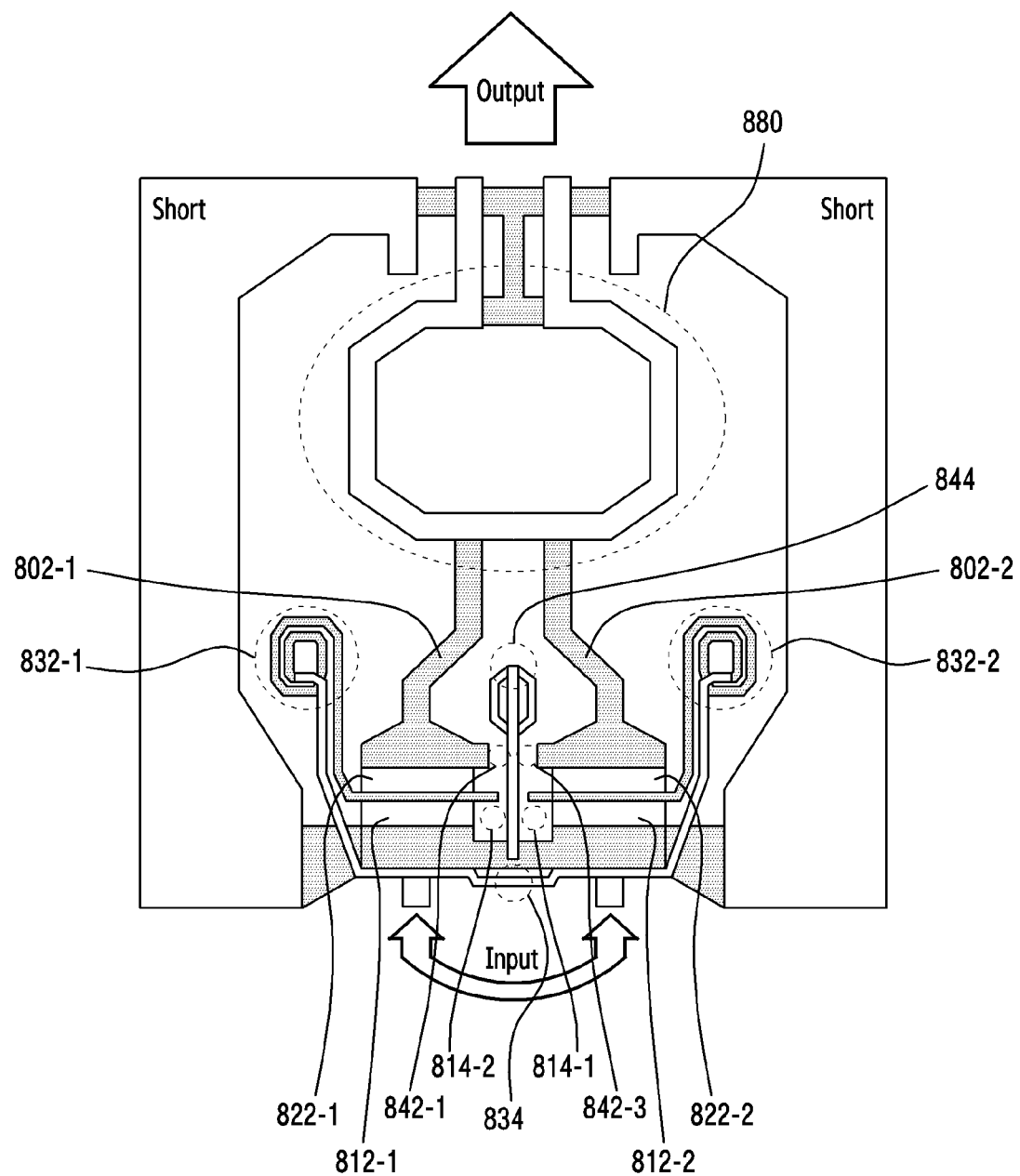
FIG. 8 is a view illustrating a layout of a power amplifier included in a transmission device according to various embodiments of the disclosure.

FIG. 8 illustrates a layout of a power amplifier included in a transmission device according to various embodiments of the disclosure. FIG. 8 illustrates a layout of a circuit according to the implementation example of FIG. 3.

Referring to FIGS. 3 and 8, the first transistor 312-1 and the second transistor 312-2 included in the first amplifier 310 of FIG. 3 are disposed at a first part 812-1 and a second part 812-2, and the first capacitor 314-1 and the second capacitor 314-2 included in the first amplifier 310 of FIG. 3 are disposed at a third part 814-1 and a fourth part 814-2. The first transistor 322-1 and the second transistor 322-2 included in the second amplifier 320 of FIG. 3 are disposed at a fifth part 822-1 and a sixth part 822-2. In addition, the inductors 332-1 and 332-2 included in the harmonic termination unit 330 of FIG. 3 may be implemented as a seventh part 832-1 and an eighth part 832-2 by using a transmission line, and the capacitor 334 is disposed at a ninth part 834. The first capacitor 342-1 and the second capacitor 342-2 of the harmonic termination unit 340 of FIG. 3 are disposed at a tenth part 842-1 and an eleventh part 842-2, and the inductor 344 may correspond to a twelfth part 844. The output terminals of FIG. 3 correspond to a thirteenth part 802-1 and a fourteenth part 802-2. The transformer 380 of FIG. 3 is implemented as a fifteenth part 880.

Figure 9:
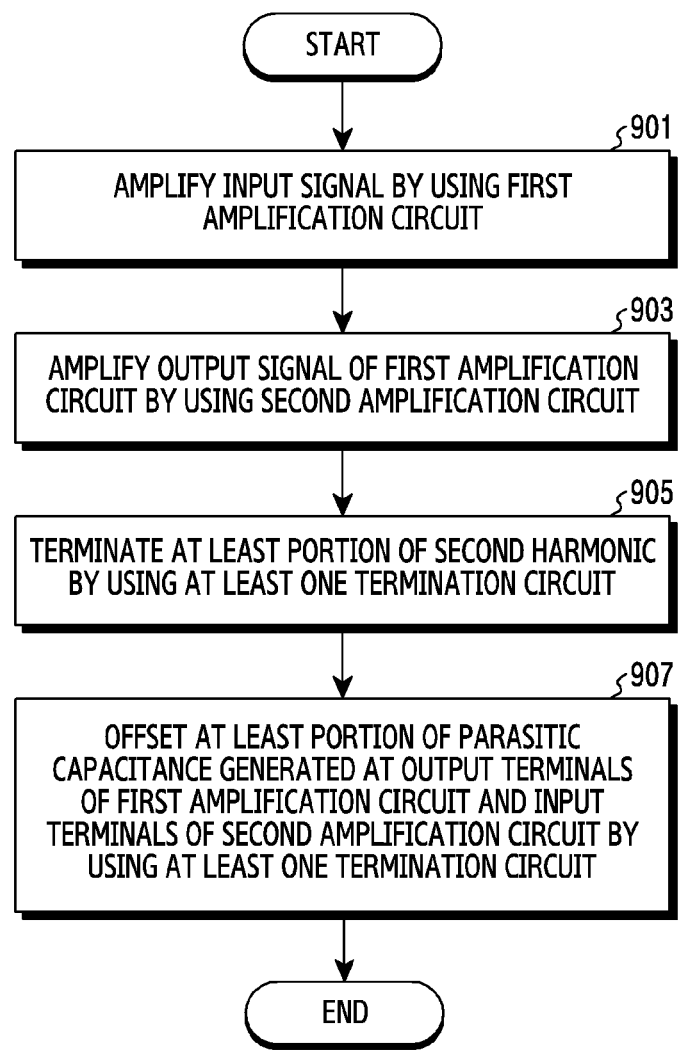
FIG. 9 is a flowchart for amplifying a signal of a transmission device according to various embodiments of the disclosure.

FIG. 9 is a flowchart for amplifying a signal in a transmission device according to various embodiments of the disclosure. FIG. 9 illustrates an operating method of the transmission device of FIG. 1.

Referring to FIG. 9, at step 901, the transmission device amplifies an input signal by using a first amplification circuit. Herein, the first amplification circuit may have a common source structure, and may include cross-coupled capacitors.

At step 903, the transmission device amplifies a signal outputted from the first amplification circuit by using a second amplification circuit. Herein, the second amplification circuit may have a common gate structure.

At step 905, the transmission device terminates at least a portion of a $2^{nd}$ order harmonic by using at least one termination circuit. The at least one termination circuit includes at least one of a first termination unit connected to output terminals of the first amplification circuit and input terminals of the second amplification circuit, a second termination unit connected to output terminals of the second amplification circuit, or a third termination unit connected to input terminals of the first amplification circuit.

At step 907, the transmission device offsets at least a portion of parasitic capacitance generated at the output terminals of the first amplification circuit and the input terminals of the second amplification circuit by using at least one termination circuit. For example, the transmission device may offset at least a portion of the parasitic capacitance by using at least one inductor having an inductance resonating with the parasitic capacitance.

Figure 10:
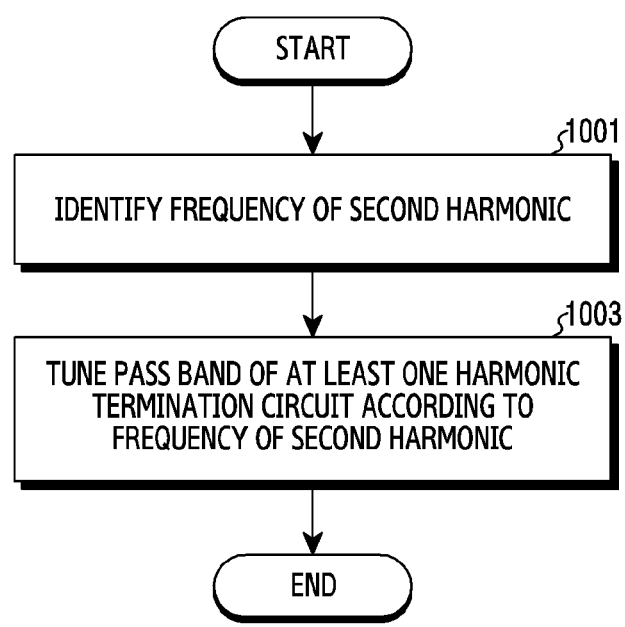
FIG. 10 is a flowchart for adaptively terminating a harmonic in a transmission device according to various embodiments of the disclosure.

FIG. 10 is a flowchart for adaptively terminating a harmonic in a transmission device according to various embodiments of the disclosure. FIG. 10 illustrates an operating method of the transmission device of FIG. 1.

Referring to FIG. 10, at step 1001, the transmission device identifies a frequency of a $2^{nd}$-order harmonic. The frequency of the $2^{nd}$-order harmonic is two times a fundamental frequency, and the fundamental frequency may be the same as a carrier frequency. Accordingly, the transmission device may identify the fundamental frequency by identifying a band in which current communication is performed, and may identify the frequency of the $2^{nd}$-order harmonic from the fundamental frequency. Herein, the band in which communication is performed may refer to an operating frequency band or a bandwidth part (BWP).

At step 1003, the transmission device tunes a pass band of at least one harmonic termination circuit according to the frequency of the $2^{nd}$-order harmonic. That is, the at least one harmonic termination circuit has a structure of an HPF type or an LPF type, and includes at least one inductor and at least one capacitor. Herein, the at least one capacitor includes a variable capacitor. Accordingly, the transmission device may tune the pass band by tuning capacitance of the variable capacitor.

Figure 11:
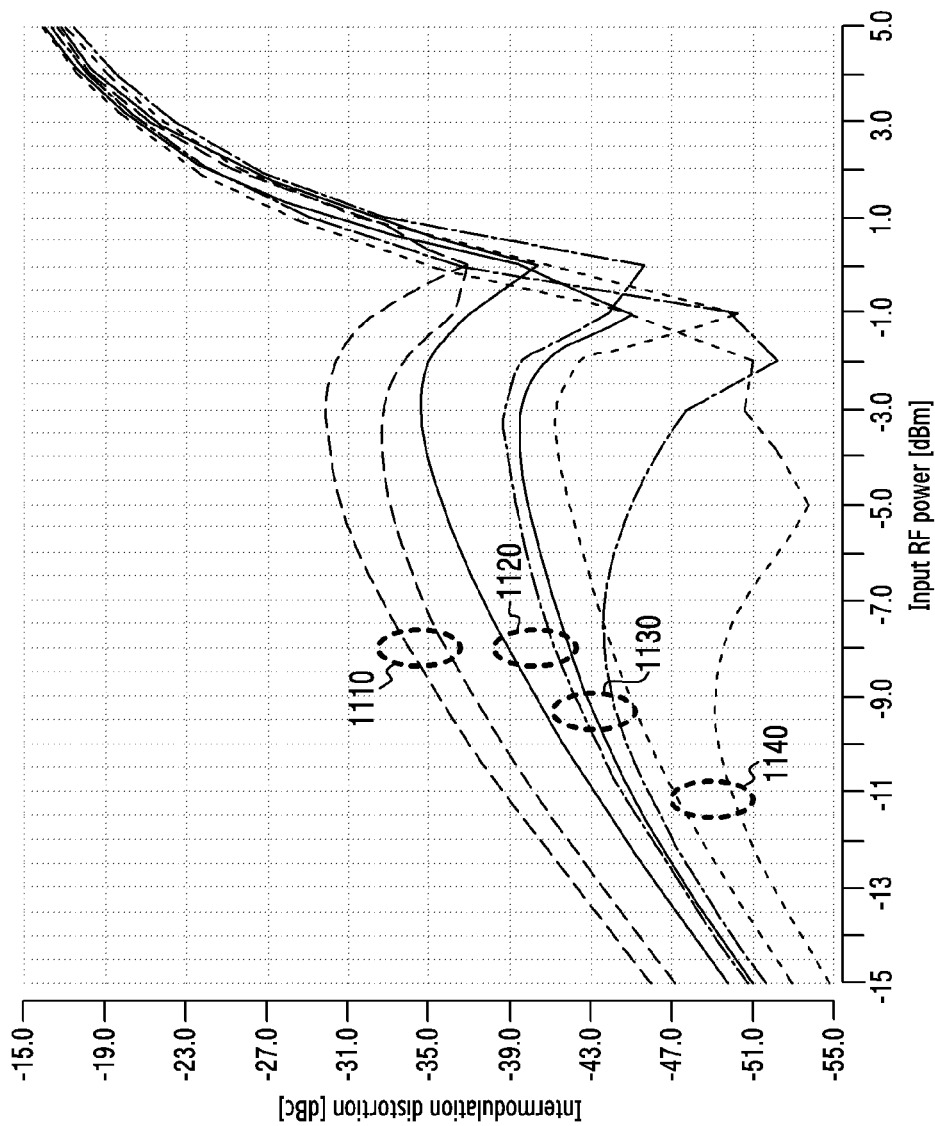
FIG. 11 is a view illustrating performance of a circuit for amplifying a signal in a transmission device according to various embodiments of the disclosure.

FIG. 11 illustrates performance of the circuit for amplifying a signal in the transmission device according to various embodiments of the disclosure. FIG. 11 illustrates an intermodulation distortion according to input radio frequency (RF) power in a first case 1110 where harmonic termination is not performed, a second case 1120 where harmonic termination is performed only at an output terminal, a third case 1130 where harmonic termination is performed only in a center, that is, in a center of a common source amplifier and a common gate amplifier, a fourth case 1140 where harmonic termination is performed at both an output terminal and a center. Referring to FIG. 11, it is identified that the intermodulation distortion is reduced, that is, linearity is enhanced in the order of the first case 1110, the second case 1120, the third case 1130, and the fourth case 1140.

Methods based on the claims or the embodiments disclosed in the disclosure may be implemented in hardware, software, or a combination of both.

When implemented in software, a computer readable storage medium for storing one or more programs (software modules) may be provided. The one or more programs stored in the computer readable storage medium are configured for execution performed by one or more processors in an electronic device. The one or more programs include instructions for allowing the electronic device to execute the methods based on the claims or the embodiments disclosed in the disclosure.

The program (the software module or software) may be stored in a random access memory, a non-volatile memory including a flash memory, a read only memory (ROM), an electrically erasable programmable read only memory (EEPROM), a magnetic disc storage device, a compact disc-ROM (CD-ROM), digital versatile discs (DVDs) or other forms of optical storage devices, and a magnetic cassette. Alternatively, the program may be stored in a memory configured in combination of all or some of these storage media. In addition, the configured memory may be plural in number.

Further, the program may be stored in an attachable storage device capable of accessing the electronic device through a communication network such as the Internet, an Intranet, a local area network (LAN), a wide LAN (WLAN), or a storage area network (SAN) or a communication network configured by combining the networks. The storage device may access via an external port to a device which performs the embodiments of the disclosure. In addition, an additional storage device on a communication network may access to a device which performs the embodiments of the disclosure.

In the above-described specific embodiments of the disclosure, elements included in the disclosure are expressed in singular or plural forms according to specific embodiments. However, singular or plural forms are appropriately selected according to suggested situations for convenience of explanation, and the disclosure is not limited to a single element or plural elements. An element which is expressed in a plural form may be configured in a singular form or an element which is expressed in a singular form may be configured in plural number.

While the disclosure has been shown and described with reference to certain preferred embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

The invention claimed is:

1. A transmission device comprising:
a first amplifier of a common source structure and comprising cross coupled capacitors, and configured to amplify an input signal;
a second amplifier of a common gate structure configured to amplify a signal outputted from the first amplifier; and
a first termination unit connected to output terminals of the first amplifier and input terminals of the second amplifier, and configured to terminate at least a portion of a second harmonic,
wherein the first termination unit is configured to offset at least a portion of parasitic capacitance generated at the output terminals of the first amplifier and the input terminals of the second amplifier with respect to a fundamental frequency, and to ground a signal having a frequency of the second harmonic with respect to the frequency of the second harmonic,
wherein the first termination unit consists of a first inductor, a second inductor, and a capacitor,
wherein one end of the first inductor is connected to one of the output terminals of the first amplifier and one of the input terminals of the second amplifier,
wherein one end of the second inductor is connected to the other one of the output terminals of the first amplifier and the other one of the input terminals of the second amplifier,
wherein the other ends of the first inductor and the second inductor are connected with each other and are connected with one end of the capacitor, and
wherein the other end of the capacitor is grounded.

2. The transmission device of claim 1, wherein the first inductor has an inductance that resonates with the parasitic capacitance.

3. The transmission device of claim 1, wherein the capacitor has capacitance which is two times capacitance resonating with an inductance of each of the first inductor and the second inductor.

4. The transmission device of claim 1, wherein the first inductor and the capacitor form a high pass filter allowing the second harmonic to pass therethrough.

5. The transmission device of claim 1, wherein the capacitor comprises a variable capacitor, and
wherein the variable capacitor is tuned according to the frequency of the second harmonic to be terminated.

6. The transmission device of claim 1, wherein at least a portion of the first inductor and the second inductor is configured as a transmission line having a characteristic impedance.

7. The transmission device of claim 1, further comprising a second termination unit connected to input terminals of the first amplifier.

8. The transmission device of claim 7, wherein the second termination unit comprises a shunt capacitor or a shunt inductor.

9. The transmission device of claim 7, wherein the second termination unit comprises a primary coil and a secondary coil which operate as a transformer,
wherein the secondary coil is connected with one end of a capacitor in a center of the secondary coil, and operates as a shunt inductor, and
wherein the other end of the capacitor is grounded.

10. The transmission device of claim 1, further comprising a third termination unit connected to output terminals of the second amplifier.

11. The transmission device of claim 10, wherein the third termination unit comprises a shunt capacitor or a shunt inductor.

12. An operating method of a transmission device, the method comprising:
amplifying an input signal by using a first amplifier of a common source structure and comprising cross coupled capacitors;
amplifying a signal outputted from the first amplifier by using a second amplifier of a common gate structure;
terminating at least a portion of a second harmonic by using a first termination unit connected to output terminals of the first amplifier and input terminals of the second amplifier; and
offsetting, by using the first termination unit, at least a portion of parasitic capacitance generated at the output terminals of the first amplifier and the input terminals of the second amplifier, with respect to a fundamental frequency, and
grounding a signal having a frequency of the second harmonic, with respect to the frequency of the second harmonic,
wherein the first termination unit consists of a first inductor, a second inductor, and a capacitor, wherein one end of the first inductor is connected to one of the output terminals of the first amplifier and one of the input terminals of the second amplifier, wherein one end of the second inductor is connected to the other one of the output terminals of the first amplifier and the other one of the input terminals of the second amplifier, wherein the other ends of the first inductor and the second inductor are connected with each other and are connected with one end of the capacitor, and wherein the other end of the capacitor is grounded.

13. The method of claim 12, further comprising in order to terminate the at least a portion of a second harmonic, tuning capacitance of at least one variable capacitor of the first termination unit according to a frequency of the second harmonic to be terminated thereby tuning a pass band of the first termination unit.

14. The method of claim 12, further comprising terminating at least a portion of the second harmonic by using a second termination unit connected to input terminals of the first amplifier or a third termination unit connected to output terminals of the second amplifier.

* * * * *